United States Patent
Hilkene et al.

(10) Patent No.: US 7,968,401 B2
(45) Date of Patent: Jun. 28, 2011

(54) REDUCING PHOTORESIST LAYER DEGRADATION IN PLASMA IMMERSION ION IMPLANTATION

(75) Inventors: Martin A. Hilkene, Gilroy, CA (US); Kartik Santhanam, Fremont, CA (US); Yen B. Ta, Cupertino, CA (US); Peter I. Porshnev, San Jose, CA (US); Majeed A. Foad, Sunnyvale, CA (US)

(73) Assignee: Applied Materials, Inc.

( * ) Notice: Subject to any disclaimer, the term of this patent is extended or adjusted under 35 U.S.C. 154(b) by 123 days.

(21) Appl. No.: 12/550,142

(22) Filed: Aug. 28, 2009

(65) Prior Publication Data

US 2010/0190324 A1    Jul. 29, 2010

Related U.S. Application Data

(60) Provisional application No. 61/206,075, filed on Jan. 26, 2009.

(51) Int. Cl.
- *H01L 21/3065* (2006.01)
- *H01L 21/336* (2006.01)
- *H01L 21/425* (2006.01)
- *H01L 21/8238* (2006.01)

(52) U.S. Cl. ........ 438/230; 438/231; 438/306; 438/527; 438/529; 438/725; 257/E21.256; 257/E21.337

(58) Field of Classification Search .......... 438/527, 438/529, 725, 230, 231; 257/E21.256, E21.337
See application file for complete search history.

(56) References Cited

U.S. PATENT DOCUMENTS

| | | | |
|---|---|---|---|
| 6,409,932 B2 * | 6/2002 | Wang et al. | 216/55 |
| 2001/0027023 A1 * | 10/2001 | Ishihara | 438/706 |
| 2003/0222345 A1 * | 12/2003 | Kenyon et al. | 257/751 |
| 2004/0214448 A1 * | 10/2004 | Chan et al. | 438/725 |
| 2005/0112883 A1 * | 5/2005 | Savas et al. | 438/689 |
| 2007/0228008 A1 * | 10/2007 | Wolfe et al. | 216/67 |
| 2008/0044958 A1 * | 2/2008 | Hwang | 438/154 |
| 2008/0102644 A1 | 5/2008 | Goto et al. | 438/710 |

FOREIGN PATENT DOCUMENTS

| | | |
|---|---|---|
| KR | 19990051892 | 7/1999 |
| KR | 1020050110540 | 11/2005 |

* cited by examiner

*Primary Examiner* — Walter L Lindsay, Jr.
*Assistant Examiner* — Ron Pompey
(74) *Attorney, Agent, or Firm* — Robert M. Wallace

(57) ABSTRACT

A method of plasma immersion ion implantation of a workpiece having a photoresist mask on its top surface prevents photoresist failure from carbonization of the photoresist. The method includes performing successive ion implantation sub-steps, each of the ion implantation sub-steps having a time duration over which only a fractional top portion of the photoresist layer is damaged by ion implantation. After each one of the successive ion implantation sub-steps, the fractional top portion of the photoresist is removed while leaving the remaining portion of the photoresist layer in place by performing an ashing sub-step. The number of the successive ion implantation sub-steps is sufficient to reach a predetermined ion implantation dose in the workpiece.

20 Claims, 6 Drawing Sheets

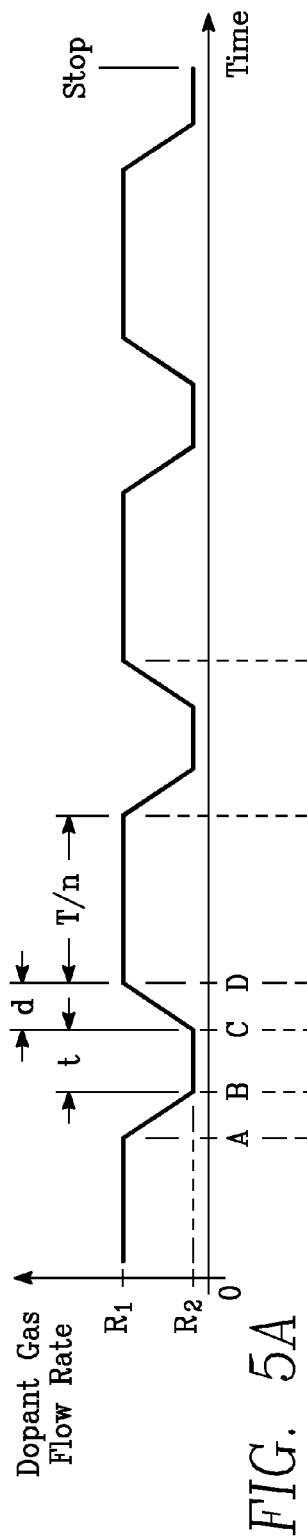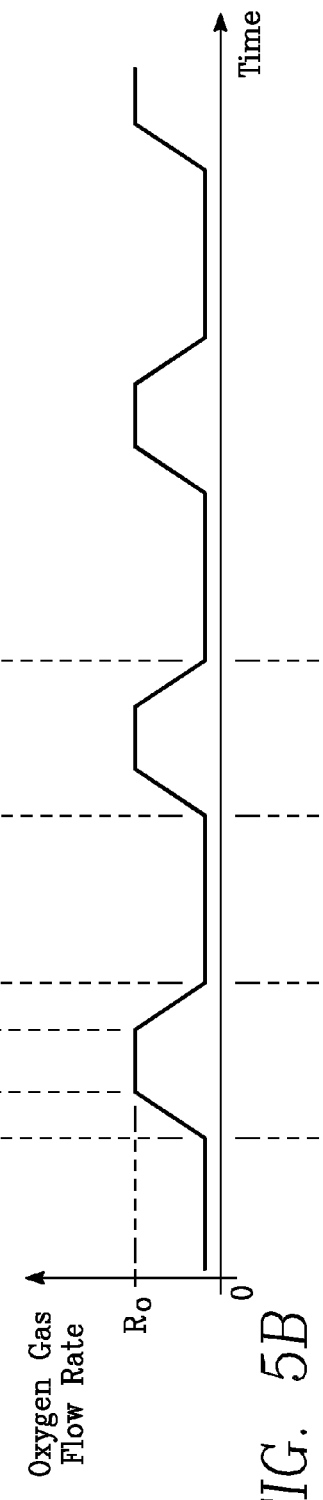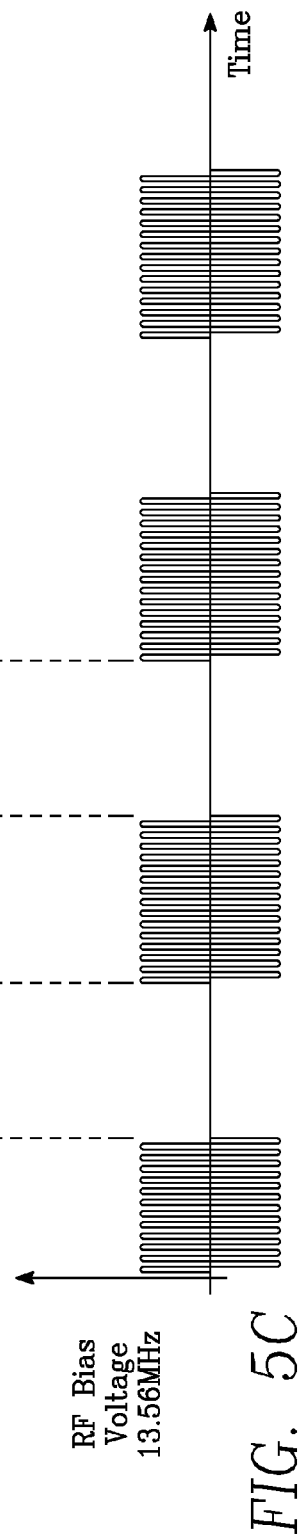

REDUCING PHOTORESIST LAYER DEGRADATION IN PLASMA IMMERSION ION IMPLANTATION

CROSS-REFERENCE TO RELATED APPLICATIONS

This application claims the benefit of U.S. Provisional Application Ser. No. 61/206,075, filed Jan. 26, 2009 entitled REDUCING PHOTORESIST LAYER DEGRADATION IN PLASMA IMMERSION ION IMPLANTATION, by Martin A. Hilkene, et al.

BACKGROUND

Plasma immersion ion implantation has emerged as a highly productive alternative to ion beam implantation. A workpiece such as a semiconductor wafer is immersed in a plasma formed from a gas containing a chemical species to be ion implanted, such as a dopant. For dopant species used in semiconductors, the process gas may be a hydride or fluoride of a dopant species such as arsenic, boron or phosphorus. The ion implant dose rate is a function of the plasma ion density, while the ion implant depth profile is a function of the bias voltage applied to the workpiece. As used herein the term ion implant dose refers to the concentration of ion implanted atoms in the implanted layer of the workpiece, the concentration typically being measured in atoms per cubic centimeter. The term dose rate refers to the time of increase of the dose during ion implantation. In some applications, the ion implantation is performed in accordance with a predetermined pattern on the workpiece surface established by a photoresist mask deposited by a photolithographic process. In this case, the photoresist mask is a film thicker than the penetration depth of the ions. For many applications such as doping of the source and drain of a field effect transistor, the junction depth is determined by the implant depth profile, which is controlled by the bias voltage applied to the workpiece. For typical junction depths, the bias voltage is relatively high, in the range of tens of kiloVolts. The impact of the ions within the photoresist layer damages the photoresist by breaking the hydrogen-carbon bonds in the photoresist. The photoresist is sufficiently porous to permit the free hydrogen to outgas through the photoresist. The damage leads to carbonization of the photoresist film, by the loss of hydrogen atoms and, ultimately, formation of carbon-carbon bonds, starting at the top surface of the photoresist layer. As the carbon-carbon bonds proliferate, a diamond-like non-porous region begins to grow in the photoresist film, starting at the top surface of the photoresist film, and progressing downward. Once this region has grown to a sufficient thickness, it traps hydrogen gas produced in the lower (remaining) portion of the photoresist film that has not yet carbonized. The trapped hydrogen gas forms bubbles in the photoresist film that eventually break, causing the photoresist film to fail, generating contamination at unacceptable levels. Another problem is that the diamond-like carbonized photoresist is difficult to remove after completion of the plasma immersion ion implantation process. This is particularly true if the entire photoresist layer has been carbonized upon completion of the ion implantation process. Removal of all the photoresist after completion of the ion implantation process is required to avoid process contamination in subsequent fabrication steps.

The problem of removing the carbonized photoresist has been addressed by employing a three-step photoresist ashing process to remove all of the photoresist in a single continuous effort, consisting of (1) a de-ionized water flush of the wafer surface, (2) an oxygen ashing step, and (3) exposure to sulfuric acid and hydrogen peroxide. This three-step photoresist removal process has three limitations. First, it can neither prevent nor cure the contamination caused by bubbling or failure of the photoresist. Second, it does not necessarily remove all of the carbonized photoresist. Third, it is believed that the oxygen chemistry of the second step of the ashing process may remove implanted dopant species such as boron from some areas of the workpiece, degrading uniformity of dopant distribution across the workpiece surface.

What is needed is a plasma immersion ion implantation process that does not cause the photoresist layer to fail while permitting all of the photoresist material to be removed after completion of the implantation process.

SUMMARY

A method of plasma immersion ion implantation of a workpiece having a photoresist mask on its top surface prevents photoresist failure from carbonization of the photoresist. The method includes performing successive ion implantation sub-steps, each of the ion implantation sub-steps having a time duration over which only a fractional top portion of the photoresist layer is damaged by ion implantation. After each one of the successive ion implantation sub-steps, the fractional top portion of the photoresist is removed while leaving the remaining portion of the photoresist layer in place by performing an ashing sub-step. The number of the successive ion implantation sub-steps is sufficient to reach a predetermined ion implantation dose in the workpiece.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 5A through 5C are contemporaneous timing diagrams depicting an embodiment employing RF bias voltage on the wafer, of which FIG. 5A depicts the flow-rate of the ion implantation species-containing gas as a function of time, FIG. 5B depicts the flow rate of oxygen gas as a function of time and FIG. 5C depicts the output of the bias power generator as a function of time.

FIGS. 6A through 6C are contemporaneous timing diagrams depicting an embodiment employing a pulsed D.C. bias voltage on the wafer, of which FIG. 6A depicts the flow-rate of the ion implantation species-containing gas as a function of time, FIG. 6B depicts the flow rate of oxygen gas as a function of time and FIG. 6C depicts the output of the bias power generator as a function of time.

Figure 1:
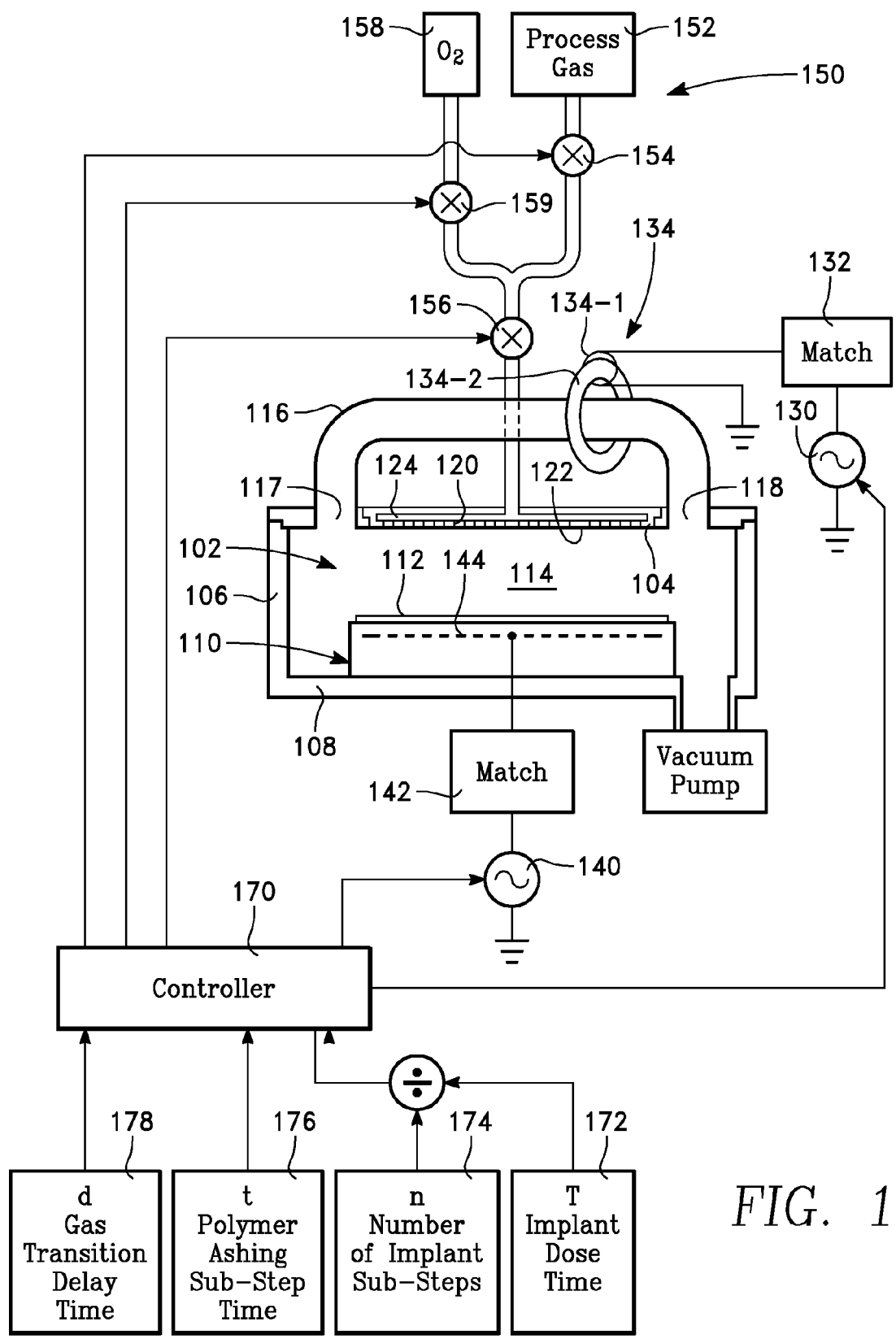
FIG. 1 depicts a plasma reactor in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 illustrates a plasma immersion ion implantation tool adapted to carry out a method in accordance with one embodiment. A reactor chamber 102 is enclosed by a ceiling 104, a cylindrical side wall 106 and a floor 108. A wafer support pedestal 110 can support a workpiece such as a semiconductor wafer 112 facing the ceiling 104, a process zone 114 being defined between the wafer 112 and the ceiling 104. A hollow external reentrant conduit 116 extends between opposite sides of the chamber 102 and is coupled to the interior of the chamber 102 through ports 117 and 118 in the ceiling 104 located on opposite sides of the chamber 102. The hollow reentrant conduit 116 completes a closed path extending through the process zone 114. The ceiling 104 is a gas distribution plate that includes an array of gas injection orifices 120 in the bottom surface 122 of the ceiling 104 fed by an internal gas plenum 124.

An RF plasma source power generator 130 is connected through an RF impedance match element 132 to an RF power applicator 134. Optionally, the RF frequency is varied or swept to find an impedance match, instead of employing the impedance match element 132. The RF power applicator 134 couples RF power into the reentrant conduit 116. In the embodiment of FIG. 1, the RF power applicator 134 includes a coil 134-1 wrapped around an iron core 134-2 that surrounds a section of the reentrant conduit 116. An RF bias power generator 140 is connected through an RF impedance match element 142 to a conductive element of the pedestal 110, such as an insulated electrode 144 within the wafer support pedestal 110. Although not depicted in FIG. 1, the reactor may further include a second hollow external reentrant conduit similar but transverse to the conduit 116 depicted in FIG. 1. A second RF power applicator similar to the RF power applicator 134 depicted in FIG. 1 would couple RF source power from an RF generator into the second conduit.

A gas source 150 includes a first gas supply 152 of a process gas containing a chemical species to be implanted in the wafer 112, such as a hydride or fluoride of a dopant species. The dopant species may be arsenic, phosphorus or boron, for example. The gas supply 152 is connected through a mass flow controller apparatus 154 and a main valve 156 to the internal gas plenum 124 of the gas distribution plate or ceiling 104. The gas source 150 further includes a second gas supply 158 of an ashing species such as oxygen. The second gas supply 158 is connected through a mass flow controller 159 and through the main valve 156 to the plenum 124.

A system controller 170 governs the mass flow controllers 154, 159, the main valve 156, and the RF generators 130, 140. The controller 170 regulates the ion implant dose rate by controlling the output power of the source power generator 130 and regulates the ion implant depth profile by controlling the output power of the bias power generator 140. The controller has a first user interface 172 for accepting a user-defined total implant time T that may be selected by the user to determine the implant dose. The controller 170 further has a second user interface 174 for accepting a user defined number n of time windows into which the total implant time T is to be divided. A third user interface 176 of the controller 170 accepts a user defined time t for performing a partial oxygen ashing interim step between successive ion implant time windows. A fourth user interface 178 of the controller 170 accepts a user defined delay time d required to stabilize the chamber pressure when transitioning between different process gases.

Prior to plasma immersion ion implantation, a photoresist mask is placed on the wafer surface to confine the ion implantation within a desired pattern. Plasma immersion ion implantation is performed by flowing the implant species-containing gas from the supply 152 through the ceiling gas distribution plate 104, applying a level of plasma source power from the RF generator 130 corresponding to a desired implant dose rate, and applying a level of plasma bias power from the RF generator 140 corresponding to a desired ion implantation depth or depth profile.

Figure 2A:
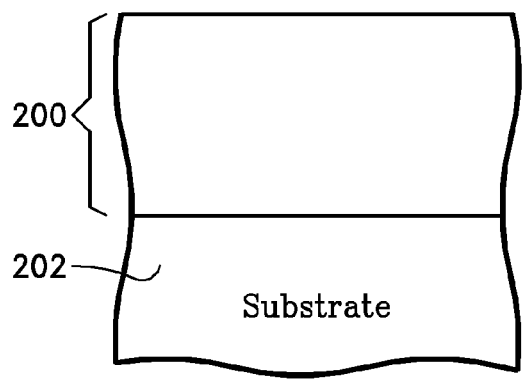
FIGS. 2A, 2B, 2C and 2D illustrate the growth of a damaged or carbonized region of the photoresist layer during a conventional ion implantation process.
Figure 2B:
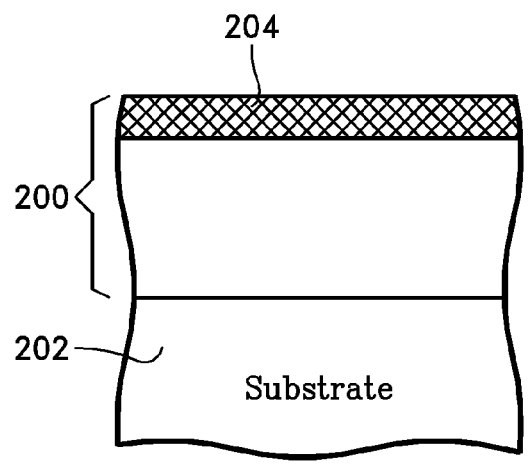
Figure 2C:
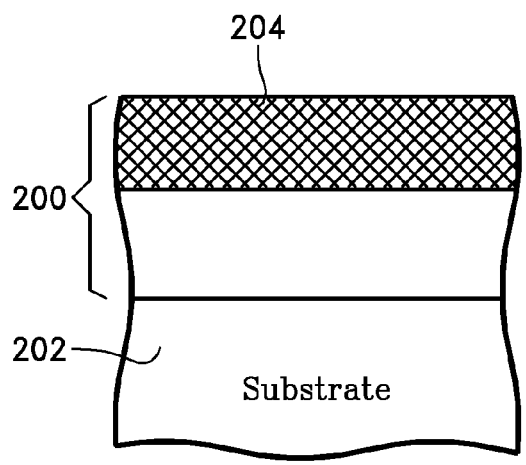
Figure 2D:
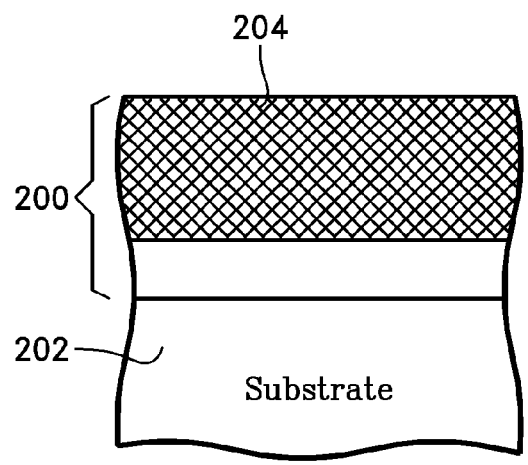

One approach is to continuously maintain the foregoing process conditions until the desired concentration of implanted ions in the wafer surface has been achieved. In some processes, this may be a duration as great as 60 seconds or more, depending upon the selected process conditions. The bias voltage required to reach the desired ion implantation depth may be on the order of 80V to 20 KV. The problem is that exposing the photoresist to ions having energies in the kilovolt range damages the photoresist by breaking carbon-hydrogen bonds, eventually leading to carbonization of the photoresist film. FIGS. 2A through 2D illustrate transformation over time of a photoresist layer 200 under bombardment of ions during a plasma immersion ion implantation process. The photoresist layer 200 is a mask overlying a substrate 202 corresponding to the wafer 112 of FIG. 1. As depicted in FIGS. 2A through 2D, the carbonization begins at the top surface of the photoresist. Initially, the photoresist layer 200 is uniform (FIG. 2A). A top portion 204 of the photoresist layer 200 begins to be carbonized by the breakage of carbon-hydrogen bonds and outgassing of hydrogen. As the process continues, the carbonized top portion 204 grows downward (FIG. 2C) until nearly the entire photoresist layer 200 has been carbonized (FIG. 2D). By this time, much of the carbonized photoresist has formed diamond-like carbon-carbon bonds, making it very difficult to remove.

In order to solve this problem, the controller 170 is programmed to divide the ion implantation process into successive sub-steps separated by photoresist ashing sub-steps. The ion implantation sub-steps and the ashing sub-steps are performed in alternating sequence. Each ion implantation sub-step is performed for a time duration equal to the total required implant time T divided by the number n of ion implant sub-steps. Each ashing sub-step is performed for a time duration that is just sufficient to remove a top layer of the photoresist damaged during the prior ion implantation sub-step while leaving the remaining portion of the photoresist intact. During each ion implantation sub-step, the controller 170 sets the flow rate of implant species-containing gas from the gas supply 152 to a predetermined level while holding the oxygen flow rate from the gas supply 158 to zero, and sets the output of the bias power generator 140 to a predetermined power (voltage) level to provide the desired implant depth profile in the wafer 112. During each oxygen ashing sub-step, the controller 170 halts ion implantation by stopping power flow from the bias power generator 140 to the wafer pedestal 110 (while continuing to apply plasma source power from the RF source power generator 130), reduces the gas flow rate from the implant species-containing gas supply 152 to a minimal level, and establishes a predetermined oxygen flow rate from the oxygen supply 158.

Figure 3:
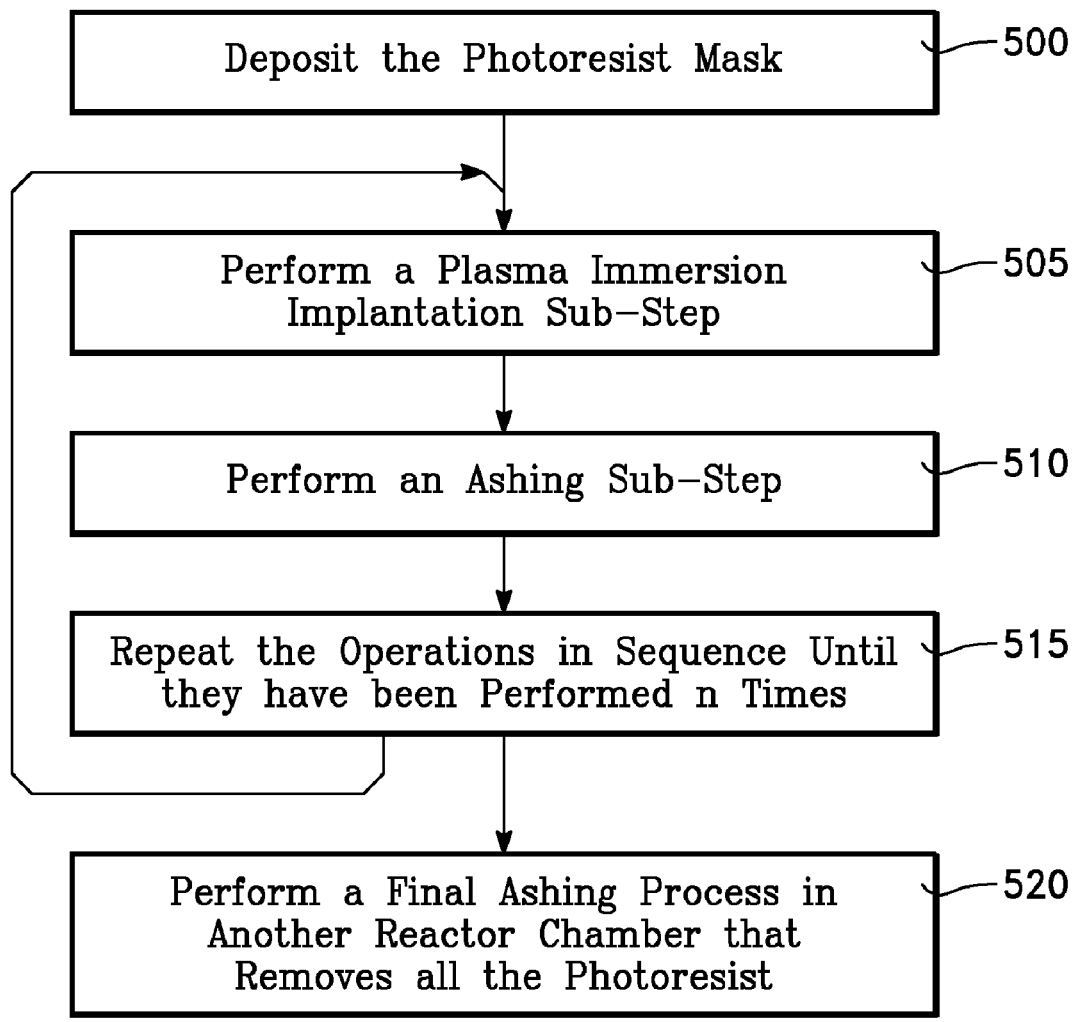
FIG. 3 is a flow diagram of a process in accordance with an embodiment.

The entire implantation process including the alternating sequence of implant sub-steps and ashing sub-steps is depicted in FIG. 3. The first step is to deposit the photoresist mask (block 500 of FIG. 3). This first step may be performed in a chamber different from the ion implantation plasma reactor of FIG. 1. Then, the plasma immersion ion implantation sub-step is performed (block 505 of FIG. 3) in the reactor of FIG. 1. Thereafter, the ashing sub-step is performed (block 510 of FIG. 3) while leaving the wafer in place in the reactor of FIG. 1. The operations of blocks 505 and 510 are repeated in sequence until they have been performed n times (block 515). The wafer 112 is then subjected to a final ashing process that removes all the photoresist (block 520). This last ashing step may be performed in another reactor.

Figure 4A:
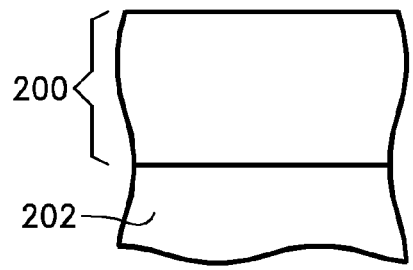
FIGS. 4A through 4G depict the photoresist layer following successive ion implantation sub-steps and ashing sub-steps in the process of FIG. 3.
Figure 4B:
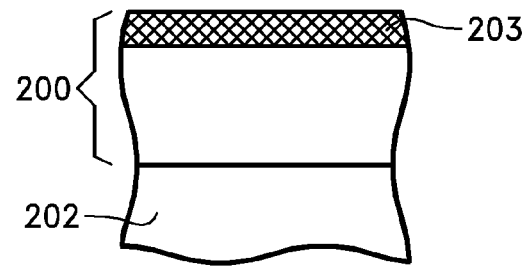
Figure 4C:
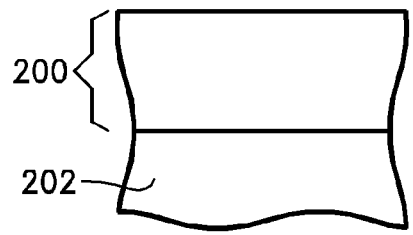
Figure 4D:
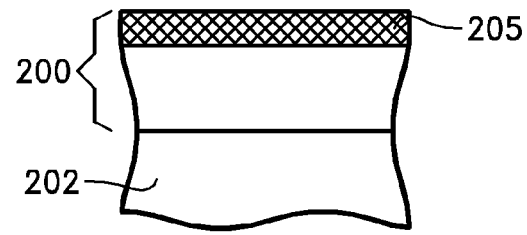
Figure 4E:
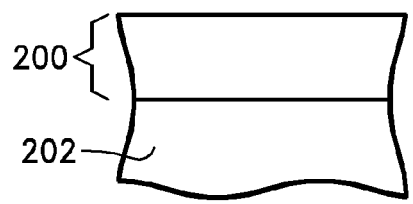
Figure 4F:
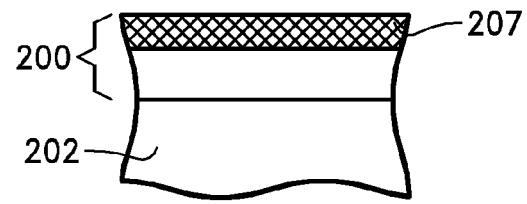
Figure 4G:
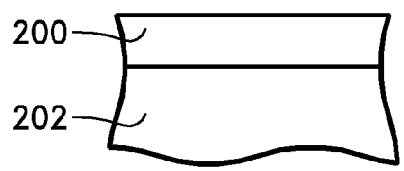

FIGS. 4A through 4G depict the photoresist layer 200 and substrate 202 during successive implantation and ashing sub-steps carried out entirely within the reactor of FIG. 1. In the example of FIGS. 4A through 4G, the number of implant sub-steps, n, is three. Prior to implantation, the photoresist layer 200 is uniform (FIG. 4A). After carrying cut a first ion implantation sub step for a fraction (⅓) of the time required to reach the desired implant dose, a first top portion 203 (FIG. 4B) of the photoresist layer 200 has been damaged by breakage of carbon-hydrogen bonds and outgassing of hydrogen resulting from the bombardment of the ions from the plasma. In one embodiment, the duration of the ion implantation sub-step is sufficiently limited to avoid complete carbonization of the damaged top layer 203 by formation of diamond-like carbon-carbon bonds. During a first ashing sub-step, ion implantation is halted and the first damaged top portion 203 is removed, leaving the undamaged remainder of the photoresist (FIG. 4C). A second ion implantation sub-step is performed, creating a second damaged top portion 205 (FIG. 4D) in the remainder of the photoresist layer 200. A second ashing sub-step removes the second damaged top portion 205 (FIG. 4E). A third ion implantation sub-step forms a third damaged top portion 207 of the remaining photoresist layer 200 (FIG. 4F). The third damaged top portion is removed in a third ashing sub-step (FIG. 4C). Each of the ashing sub-steps may not completely remove all of the photoresist. Therefore, the wafer may be removed from the ion implantation chamber and placed in a reactor configured to perform a final more thorough ashing step.

The sequence depicted in FIGS. 4A through 4G involves successive reductions in the photoresist layer thickness. Each ashing sub-step removes a portion of the photoresist layer. During the last of the successive ion implantation sub-steps, the photoresist thickness is the minimum. The initial photoresist thickness therefore should be sufficient to ensure that the successive reductions in photoresist thickness by the successive ashing sub-steps do not reduce the photoresist thickness below the ion penetration depth in the photoresist before the final ion implantation sub-step. This thickness depends upon the ion energy or bias voltage applied during the ion implant sub-steps. In one example, the ion penetration depth of the photoresist was about 10 nm, and each ion implantation sub-step damaged a 1 nm thick top layer of the photoresist. Each ashing sub-step removed the damaged layer by removing about 1 nm of the photoresist. In this example, there were three ion implantation sub-steps, and the photoresist layer had an initial thickness of about 12 nm, so that after two ion implantation and ashing sub-steps, the remaining photoresist thickness was not less than the ion implant penetration depth in the photoresist.

In one embodiment, the duration of each ion implantation sub-step is sufficiently short to prevent the formation of a large number of carbon-carbon bonds in the succession of ion-damaged top portions 203, 205, 207. While allowing breakage of carbon-hydrogen bonds in the photoresist and loss of hydrogen, the limited implant sub-step duration avoids the formation of films with a predominantly diamond-like structure that is difficult to remove. Alternatively, even if a diamond-like structure were formed in a portion of the damaged layer, the damaged layer is a fraction (1/n) of the initial photoresist thickness at the conclusion of the implant sub-step, and is therefore easier to remove than an entire photoresist layer that has been completely carbonized. Such favorable results may be obtained where a larger implant dose or longer total implant time T is needed, by increasing n, the number of sub-steps into which the ion implantation is divided.

Operation of the controller 170 of FIG. 1 is illustrated in the contemporaneous timing diagrams of FIGS. 5A, 5B and 5C. FIG. 5A is a graph of the gas flow rate from the gas supply 152 as a function of time. This gas flow furnishes the species to be ion implanted (e.g., a fluoride or hydride of a dopant species such as arsenic, boron or phosphorus, for example). FIG. 5B is a graph of the gas flow rate from the oxygen gas supply 158 as a function of time. FIG. 5C is a graph of the RF voltage output from the bias power generator 140. These graphs depict the manner in which the controller 170 governs the dopant-containing gas through the mass flow controller 154, the oxygen gas through the mass flow controller 159, and the output of the bias power generator 140.

The first ion implantation sub-step occurs from time zero to time A of FIGS. 5A-5C. During the ion implantation sub-step, the implant species-containing gas flow rate is at a predetermined maximum rate, R1 (FIG. 5A), the oxygen gas flow rate is at zero (FIG. 5B) and the RF bias voltage is at a predetermined level corresponding to the desired ion implantation depth (FIG. 5C). The RF bias frequency may be about 13.56 MHz. A zero oxygen gas flow rate during the ion implantation sub-step prevents ion implantation of oxygen. At time A, the bias power is turned off (FIG. 5C) to end the ion implantation sub-step. A transitional period occurs from time A to time B, during which a transition is made from implant species-containing gas to oxygen gas, during which the chamber pressure may fluctuate. During this transitional period, the implant species-containing gas flow rate (FIG. 5A) is brought down to a minimum rate, R2, while the oxygen gas flow rate (FIG. 5B) is brought up to a predetermined maximum rate Ro. The duration of the transitional period from time A to time B, typically a few seconds, depends upon the responsiveness of the mass flow controllers and upon the characteristics of the chamber pressure control system. At time B, the chamber pressure has stabilized. An ashing sub-step occurs from time B to time C, during which the plasma is an oxygen plasma that removes the photoresist top portion 203 (FIG. 4B) damaged during the previous ion implantation sub-step. At time C, the damaged photoresist top portion 203 (FIG. 4B) has been removed or nearly removed, and a second transitional period begins. This second transitional period extends from time C to time D, during which the oxygen gas flow rate (FIG. 5B) is ramped down while the implant species-containing gas flow rate (FIG. 5A) is ramped up, creating some fluctuations in chamber pressure. At time D, the oxygen flow rate has reached zero while the implant species-containing gas flow rate has reached the predetermined maximum rate R1, and the chamber pressure has stabilized, concluding the transitional period. A second ion implantation sub-step begins at time D, when the bias power is again turned on (FIG. 5C). The events from time zero to time D constitute a complete cycle, which is repeated n times, where n is 3 in the example of FIGS. 5A-5C.

Each ion implantation sub-step may have a duration of about 2-90 seconds, during which the implant species-containing gas flow rate through the mass flow controller 154 may be in the range of about 5-350 sccm and the bias voltage on the wafer is on the order of 80V to 20 KV. The transitional period from time A to time B may have a duration of about two seconds. The ashing sub-step from time B to time C may have a duration of about 1-20 seconds, during which the oxygen gas flow rate through the mass flow controller 159 is in the range of about 5-100 sccm while the implant species-containing gas flow rate through the mass flow controller 154 is at a minimum of about 5 sccm. The number, n, of sub-steps into which the required ion implantation time is divided is sufficient to limit each ion implantation sub-step to a time duration within which the damaged layer formed at the top of the photoresist layer does not completely carbonize and grows to only a fraction of the total photoresist thickness.

Figure 6A:
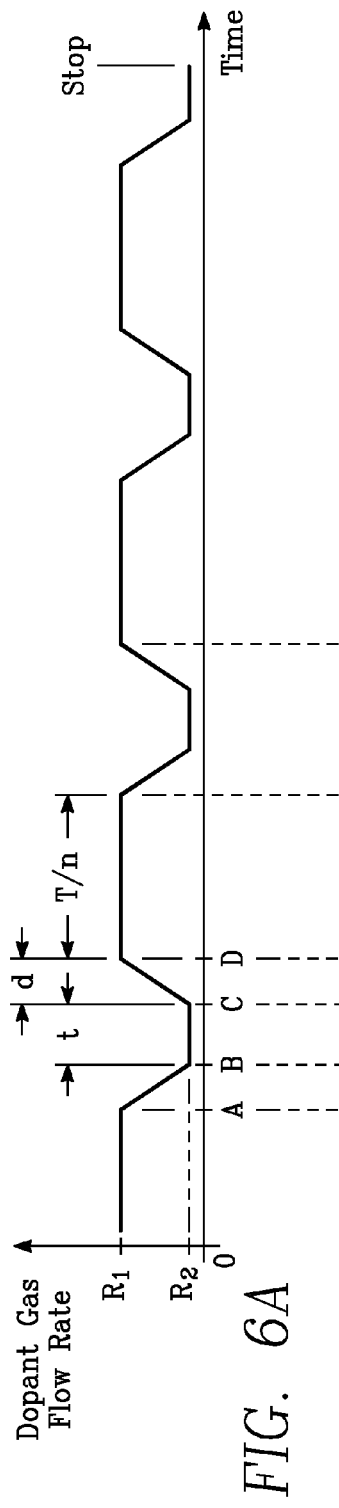
Figure 6B:
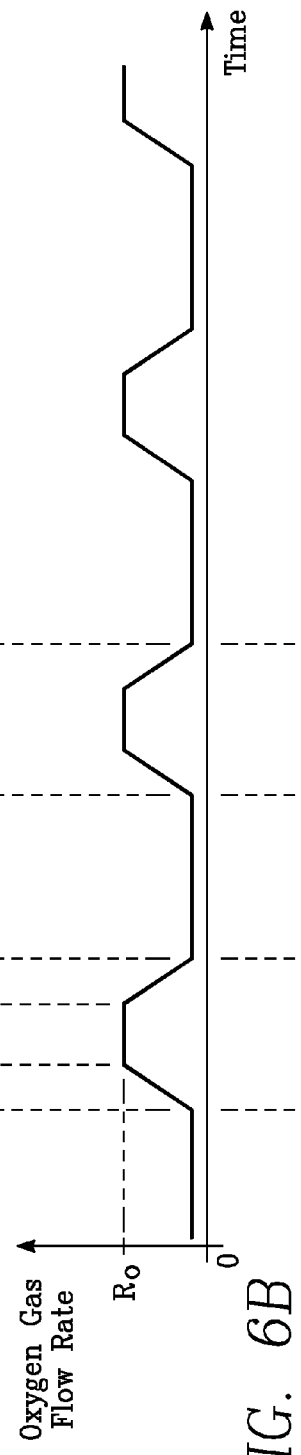
Figure 6C:
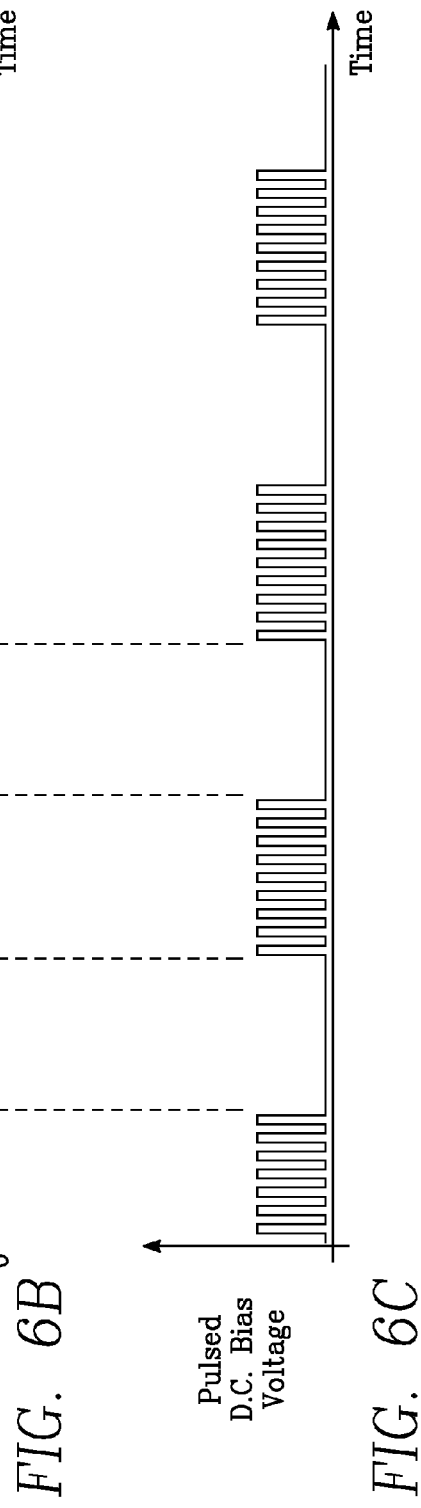

While the foregoing description has been made with reference to embodiments employing an RF bias voltage applied to the wafer or wafer support pedestal 110, other embodiment may employ a D.C. bias source or a pulsed D.C. bias source. The pulsed D.C. bias source may have a pulse duration on the order of milliseconds and a pulse repetition rate on the order of kilohertz. The duration of each ion implant sub-step may be about 2-100 seconds, depending upon the desired implant dose and depending upon the plasma ion density. The process employing a pulsed D.C. bias on the wafer is depicted in the contemporaneous timing diagrams of FIGS. 6A, 6B and 6C. FIG. 6A is a graph of the gas flow rate from the ion implant species-containing gas supply 152 as a function of time. FIG. 6B is a graph of the gas flow rate from the oxygen gas supply 158 as a function of time. FIG. 6C is a graph of the pulsed D.C. bias voltage applied to the wafer 112.

The first ion implantation sub-step occurs from time zero to time A of FIGS. 6A-6C. During the ion implantation sub-step, the implant species-containing gas flow rate is at a predetermined maximum rate, R1 (FIG. 6A), the oxygen gas flow rate is at zero (FIG. 6B) and the pulsed D.C. bias voltage is at a predetermined level corresponding to the desired ion implantation depth (FIG. 6C). A zero oxygen gas flow rate during the ion implantation sub-step prevents ion implantation of oxygen. At time A, the bias power is turned off (FIG. 6C) to end the ion implantation sub-step. A transitional period occurs from time A to time B, during which a transition is made from implant species-containing gas to oxygen gas, during which the chamber pressure may fluctuate. During this transitional period, the implant species-containing gas flow rate (FIG. 6A) is brought down to a minimum rate, R2, while the oxygen gas flow rate (FIG. 6B) is brought up to a predetermined maximum rate Ro. At time B, the chamber pressure has stabilized. An ashing sub-step occurs from time B to time C, during which the plasma is an oxygen plasma that removes the photoresist top portion damaged during the previous ion implantation sub-step. At time C, the damaged photoresist top portion has been removed or nearly removed, and a second transitional period begins. This second transitional period extends from time C to time D, during which the oxygen gas flow rate (FIG. 6B) is ramped down while the implant species-containing gas flow rate (FIG. 6A) is ramped up, creating some fluctuations in chamber pressure. At time D, the oxygen flow rate has reached zero while the implant species-containing gas flow rate has reached the predetermined maximum rate R1, and the chamber pressure has stabilized, concluding the transitional period. A second ion implantation sub-step begins at time D, when the pulsed D.C. bias power is again turned on (FIG. 6C). The events from time zero to time D constitute a complete cycle, which is repeated n times.

The time duration of each ion implantation sub-step is sufficiently limited so that the damaged top portion formed in the photoresist does not become completely non-porous. This feature prevents the entrapment of hydrogen freed within the photoresist by severance of carbon-hydrogen bonds. Such entrapment of hydrogen would create bubbles in the photoresist and cause failure of the photoresist. Thus, the method in one embodiment prevents a principal failure mode experienced in conventional plasma immersion ion implantation processes. The ion implantation sub-step time duration is also sufficiently limited to prevent formation of a large number of carbon-carbon bonds in the damaged top portion of the photoresist, leading to a diamond-like material that is difficult to remove. Thus, the method in one embodiment facilitates easy and thorough removal of the photoresist after ion implantation. As a result, the conventional three-step post-implant photoresist removal process may not be necessary. For example, the second step in that process, the oxygen plasma ashing step, may be eliminated.

While the foregoing is directed to embodiments of the present invention, other and further embodiments of the invention may be devised without departing from the basic scope thereof, and the scope thereof is determined by the claims that follow.

What is claimed is:

1. A method of plasma immersion ion implantation of a workpiece having a photoresist layer on its top surface, comprising:
    performing a number of successive ion implantation sub-steps, each of said ion implantation sub-steps having a time duration over which transformation by removal of hydrogen is generally confined to a top portion of the photoresist layer;
    after each one of said successive ion implantation sub-steps, removing said top portion while leaving the remaining portion of said photoresist layer in place by performing an ashing sub-step;
    wherein the number of said successive ion implantation sub-steps is sufficient to reach a predetermined ion implantation dose in a region of said workpiece.

2. The method of claim 1 wherein the time duration of each ion implantation sub-step is sufficiently limited to prevent transformation of said top portion of said photoresist layer to a material containing predominantly carbon-carbon bonds.

3. The method of claim 1 wherein the time duration of each ion implantation sub-step is sufficiently limited to prevent transformation of said top portion of said photoresist layer to a predominantly non-porous material.

4. The method of claim 1 wherein said top portion is damaged in that hydrogen-carbon bonds in the photoresist layer have been broken.

5. The method of claim 1 wherein each ion implantation sub-step comprises:
    (a) flowing an ion implantation species-containing gas into said chamber,
    (b) maintaining a plasma in said chamber,
    (c) applying a bias voltage to said workpiece corresponding to a desired ion implantation depth.

6. The method of claim 5 wherein each ashing sub-step comprises:
    (a) flowing an oxygen-containing gas into said chamber while applying negligible or no bias power to said workpiece and while limiting or stopping the flow rate of said ion implantation species-containing gas,
    (b) continuing to maintain a plasma in said chamber;
    (c) halting the flow of said oxygen-containing gas prior to the beginning of the next ion implantation sub-step.

7. The method of claim 6 further comprising performing a first transition after each ion implantation sub-step and before the following ashing sub-step, said transition comprising:
- stopping application of bias power to said workpiece;
- reducing the flow rate of said ion implantation species-containing gas into the chamber;
- increasing the flow rate of said oxygen containing gas into said chamber.

8. The method of claim 7 further comprising performing a second transition after each ashing sub-step and before the following ion implantation sub-step, said second transition comprising:
- increasing the flow rate of said ion implantation species-containing gas into the chamber;
- decreasing the flow rate of said oxygen containing gas into said chamber to a negligible or zero level.

9. A method of plasma immersion ion implantation of a workpiece, comprising:
- depositing a photoresist layer on a top surface of the workpiece and placing the workpiece in a plasma reactor chamber;
- performing successive ion implantation sub-steps, each of said ion implantation sub-steps having a time duration over which transformation by removal of hydrogen is generally confined to a top portion of said photoresist layer, each of said ion implantation sub-steps comprising:
  - (a) flowing an ion implantation species-containing gas into said chamber,
  - (b) maintaining a plasma in said chamber,
  - (c) applying a bias voltage to said workpiece corresponding to a desired ion implantation depth;
- after each one of said successive ion implantation sub-steps, performing an ashing sub-step for a time duration sufficient to remove only said top portion of said photoresist layer, said ashing sub-step comprising:
  - (a) removing or reducing the bias voltage on said workpiece;
  - (b) flowing an oxygen-containing gas into said chamber while reducing or stopping the flow rate of said ion implantation species-containing gas,
  - (c) continuing to maintain a plasma in said chamber;
  - (d) halting the flow of said oxygen-containing gas prior to the beginning of the next ion implantation sub-step;
- wherein the number of said successive ion implantation sub-steps is sufficient to reach a predetermined ion implantation dose in a region of said workpiece.

10. The method of claim 9 wherein the time duration of each ion implantation sub-step is sufficiently limited to prevent transformation of said top portion of said photoresist layer to a material of predominantly carbon-carbon bonds.

11. The method of claim 9 wherein the time duration of each ion implantation sub-step is sufficiently limited to prevent transformation of said top portion of said photoresist layer to a predominantly non-porous material.

12. The method of claim 9 wherein said top portion is damaged in that hydrogen-carbon bonds in the photoresist layer have been broken.

13. The method of claim 9 further comprising performing a first transition after each ion implantation sub-step and before the following ashing sub-step, said transition comprising:
- stopping application of bias power to said workpiece;
- reducing the flow rate of said ion implantation species-containing gas into the chamber;
- increasing the flow rate of said oxygen containing gas into said chamber.

14. The method of claim 13 further comprising performing a second transition after each ashing sub-step and before the following ion implantation sub-step, said transition comprising:
- increasing the flow rate of said ion implantation species-containing gas into the chamber;
- decreasing the flow rate of said oxygen containing gas into said chamber to a negligible or zero level.

15. A method of plasma immersion ion implantation of a workpiece having a photoresist layer on its top surface to attain a predetermined ion implantation dose in a region of the workpiece, comprising:
- performing successive ion implantation sub-steps, each of said ion implantation sub-steps having a time duration less than that required to attain said predetermined dose;
- after each one of said successive ion implantation sub-steps, removing a top portion of said photoresist layer while leaving the remaining portion of said photoresist layer in place by performing an ashing sub-step;
- wherein the number of said successive ion implantation sub-steps is sufficient to reach said predetermined ion implantation dose.

16. The method of claim 15 wherein the time duration of each ion implantation sub-step is sufficiently limited to prevent transformation of said top portion of said photoresist layer to a material containing predominantly carbon-carbon bonds.

17. The method of claim 15 wherein the time duration of each ion implantation sub-step is sufficiently limited to prevent transformation of said top portion of said photoresist layer to a predominantly non-porous material.

18. The method of claim 15 wherein said remaining portion of said photoresist layer is sufficiently thick to mask the underlying portion of said workpiece during the subsequent ion implantation sub-step.

19. The method of claim 15 wherein each ion implantation sub-step comprises:
- (a) flowing an ion implantation species-containing gas into said chamber,
- (b) maintaining a plasma in said chamber,
- (c) applying a bias voltage to said workpiece corresponding to a desired ion implantation depth.

20. The method of claim 19 wherein each ashing sub-step comprises:
- (a) flowing an oxygen-containing gas into said chamber while applying negligible or no bias power to said workpiece and while limiting or stopping the flow rate of said ion implantation species-containing gas,
- (b) continuing to maintain a plasma in said chamber;
- (c) halting the flow of said oxygen-containing gas prior to the beginning of the next ion implantation sub-step.

* * * * *